(12) United States Patent
Miyajima et al.

(10) Patent No.: US 7,205,557 B2
(45) Date of Patent: Apr. 17, 2007

(54) VARIABLE RECTANGLE-TYPE ELECTRON BEAM EXPOSURE APPARATUS AND PATTERN EXPOSURE-FORMATION METHOD

(75) Inventors: Masaaki Miyajima, Kasugai (JP); Yutaka Nakamura, Kawasaki (JP); Hiromi Hoshino, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/319,205

(22) Filed: Dec. 28, 2005

(65) Prior Publication Data

US 2006/0169925 A1    Aug. 3, 2006

Related U.S. Application Data

(63) Continuation-in-part of application No. 11/055,107, filed on Feb. 11, 2005, now abandoned.

(30) Foreign Application Priority Data

Sep. 30, 2004  (JP) .............................. 2004-288811
Sep. 30, 2005  (JP) .............................. 2005-287730

(51) Int. Cl.
   *H01L 21/27*    (2006.01)
(52) U.S. Cl. ................................. 250/492.23
(58) Field of Classification Search ........... 250/492.23, 250/492.22, 492.2
   See application file for complete search history.

(56) References Cited

U.S. PATENT DOCUMENTS 4,914,304 A    4/1990   Koyama .................. 250/492.2
6,288,407 B1   9/2001   Itoh ...................... 250/492.23

FOREIGN PATENT DOCUMENTS

JP         09-082630        3/1997

*Primary Examiner*—Kiet T. Nguyen
(74) *Attorney, Agent, or Firm*—Armstrong, Kratz, Quintos, Hanson & Brooks, LLP

(57) ABSTRACT

A variable rectangle-type electron beam exposure apparatus for forming rectangular beams of different angles which is capable of highly finely conducting exposure with respect to a predetermined fine line pattern having an arbitrary angle in the pattern region. The apparatus includes a first slit member (10) in which a plurality of rectangular apertures (11, 12) are respectively arranged by different angles; a second slit member (20) in which a plurality of rectangular apertures (21, 22) which are respectively positioned in parallel with the corresponding rectangular apertures of the first slit member, are arranged; and a deflecting unit (40) for deflecting an electron beam, which has been transmitted through a plurality of apertures of the first slit member, so that, when the electron beam transmitted through the first aperture of the first slit member is transmitted through the corresponding first aperture of the second slit member, the electron beam transmitted through the apertures except for the first aperture of the first slit can be intercepted by the second slit member.

16 Claims, 12 Drawing Sheets

VARIABLE RECTANGLE-TYPE ELECTRON BEAM EXPOSURE APPARATUS AND PATTERN EXPOSURE-FORMATION METHOD

CROSS REFERENCE TO RELATED APPLICATION

This application is a continuation-in-part application of Ser. No. 11/055,107 now abandoned filed on Feb. 11, 2005.

BACKGROUND OF THE INVENTION

1. Field of the Invention

The present invention relates to a pattern exposure technique for forming a circumferential or radial pattern on a disk-shaped recording medium of a magnetic disk device by utilizing a pattern forming technique which is used in the field of manufacturing a wiring board or semiconductor package. More particularly, the present invention relates to a variable rectangle-type electron beam exposure apparatus in which exposure is conducted with a rectangular beam. The present invention also relates to a pattern forming method for exposing and forming a pattern with the variable rectangle-type electron beam exposure apparatus described above.

2. Description of the Related Art

In order to provide magnetic disk devices having a large memory capacity, the recording density of a disk-shaped recording medium has been increased every year. Therefore, in the case where servo information is written on the disk-shaped recording medium so that a magnetic head for reading and writing the signal information on the disk-shaped recording medium can be positioned with respect to the disk-shaped recording medium, it has become difficult to form a servo information pattern with an exclusively used device while the mechanical accuracy is kept high. In order to reduce a manufacturing cost of the disk-shaped recording medium on which the servo information pattern is written, it is necessary to make the servo information for positioning easily and accurately.

In order to satisfy the requirement described above, the following method has been considered. By the electron beam exposure technique used in the manufacturing process of a semiconductor device, a master board of the positioning information pattern is first made, and then the servo information is made as a whole when the positioning information pattern is transferred to the disk-shaped recording medium. However, according to the method of the prior art, in order to form a highly accurate pattern, it is necessary to use the electron beam exposure technique. When a commonly used point beam type electron beam exposing apparatus, by which an arbitrary figure can be drawn, is used, in order to make a servo information pattern on the entire face of one piece of the disk-shaped recording medium, the diameter of which is 5 to 10 cm, by applying this technique, an extremely long exposure time is required for making the servo information pattern. Therefore, this method can not be put into practical use.

FIG. 14 is a view showing a pattern exposure and formation method conducted by the point beam type electron beam exposing machine. In FIG. 14, with respect to the pattern to be made or the area of figure A, the exposure area of point beam B is very small. Therefore, for example, in the case where exposure is conducted while point beam B is gradually shifted in order in the direction of the arrow, in order to expose the entire region of figure A, an extremely long exposure time is required as described above.

In order to solve the above problems caused in the case where the point beam type electron beam exposing machine is used, if a variable rectangle-type electron beam exposing machine is used, a reduction of the exposure time will come to be possible. Further, when an arrangement and shape of the rectangle are changed appropriately, a very fine exposure can be conducted so as to form a fine line pattern of an arbitrary angle.

FIG. 15 is a view showing a pattern exposure and formation method conducted by a variable rectangle-type electron beam exposing machine. In FIG. 15, with respect to the area of the pattern or figure A to be formed, the region area of rectangular beam B is comparatively large. Therefore, when exposure is conducted while rectangular beam B is gradually shifted, exposure can be accomplished in a short period of time. According to the shape of the pattern or figure A to be formed, the shape and the size of rectangular beam B may be appropriately adjusted.

However, in the case of the variable rectangle-type electron beam exposing machine shown in FIG. 15, the following problems may be encountered. In the case where an inclined angle of the pattern or figure A to be made and an angle of rectangular beam B are different from each other, for example, in the case where the pattern or figure A to be made is extended by an inclination angle of about 45° with respect to the side of exposure region B of the rectangular beam, an edge portion of the pattern or figure A does not agree with the angle of the rectangular exposure region B. Therefore, the area of rectangular beam B must be reduced to as small as possible. After all, in the same manner as the case of the point beam type electron beam exposure, a long exposure time is required.

In this connection, the related prior art is disclosed in the official gazette of Japanese Unexamined Patent Publication (Kokai) No. 9-826630, which will be described below. The variable formation electron beam drawing apparatus disclosed in JP-A 9-82630 has the target of meeting the following demands. The degree of freedom of designing the device pattern is increased; the drawing of an inclined pattern having an arbitrary angle is demanded; and an inclined pattern having an arbitrary angle is drawn with high accuracy and high throughput without using a transfer mask. In order to meet the above demands, in the variable formation electron beam drawing apparatus having two rectangular apertures for forming a beam, a third aperture, in which a pivotal slit capable of being rotated about an optical axis by a highly accurate motor, is provided under a rectangular aperture for forming a beam, and an arbitrary parallelogram beam is formed by rotating the third aperture.

The variable formation electron beam drawing apparatus described in JP-A 9-82630 is preferably used for the exposure of an arbitrary parallelogram beam. However, with respect to a predetermined fine line pattern having an arbitrary angle, it is impossible to conduct a highly fine exposure in the pattern region.

In the case where the above conventional point beam type electron beam exposing machine is used, it takes an extremely long time for the exposing machine to expose and form the servo information pattern on the entire face of a piece of disk-shaped recording medium. Therefore, it is difficult to put the conventional point beam type electron beam exposing machine into practical use.

In the case where the conventional variable rectangle-type electron beam exposing machine is used, it is possible to conduct exposure in a short period of time, however, in order to conduct exposure with high accuracy, it is necessary to appropriately change the arrangement and shape of the rectangle. However, especially when the pattern angle and the rectangular beam angle are different from each other at the edge portion of the pattern, it is impossible to conduct exposure with high accuracy. Alternatively, when the rectangular beam size is reduced, the exposure time is prolonged.

The variable formation electron beam drawing apparatus described in JP-A 9-82630 is preferably used for the exposure of forming an arbitrary parallelogram beam. However, this variable formation electron beam drawing apparatus is not suitable for the highly accurate exposure of a predetermined fine line pattern having an arbitrary angle in the pattern region.

Therefore, it is an object of the present invention to provide a variable rectangle-type electron beam exposure apparatus and a pattern exposure-formation method capable of conducting a highly fine exposure of a predetermined fine line pattern having an arbitrary angle in the pattern region when several types of the rectangular beam angles are prepared.

SUMMARY OF THE INVENTION

In order to accomplish the above objects, the present invention provides a variable rectangle-type electron beam exposing machine for forming a rectangular beam of a different angle, comprising: a first slit member in which a plurality of rectangular apertures are respectively arranged by different angles; a second slit member in which a plurality of rectangular apertures, which are respectively positioned in parallel with the corresponding rectangular apertures of the first slit member, are arranged; and a deflecting member for deflecting an electron beam, which has been transmitted through a plurality of apertures of the first slit member, so that the electron beam, which has been transmitted through the apertures except for the first aperture of the first slit, can be intercepted by the second slit member when the electron beam, which has been transmitted through the first aperture of the first slit member, is transmitted through the corresponding first aperture of the second slit member and so that the electron beam, which has been transmitted through the apertures except for the second aperture of the first slit, can be intercepted by the second slit when the electron beam, which has been transmitted through the second aperture of the first slit passes through the corresponding second aperture of the second slit member.

The present invention provides a pattern exposure method, in which the variable rectangle-type electron beam exposing machine described in claim is used, characterized in that: an exposure pattern is formed by combining a first exposure pattern with a second exposure pattern, wherein the exposure is conducted in the first exposure pattern by slightly shifting a rectangular electron beam formed when an electron beam, which has been transmitted through the first aperture of the first slit member, is transmitted through the first aperture of the second slit member, and the exposure is conducted in the second exposure pattern by slightly shifting a rectangular electron beam formed when an electron beam, which has been transmitted through the second aperture of the second slit member, is transmitted through the second aperture of the second slit.

In the above variable rectangle-type electron beam exposure apparatus and the pattern exposure and formation method, a plurality of apertures of different angles are provided in the first and the second slit member, and the exposure can be conducted by an electron beam passing through any one set of apertures. Therefore, it is possible to provide rectangular electron beams having various angles. That is, when the first exposure pattern of a predetermined angle is combined with the second exposure pattern of a different angle, it becomes possible to conduct the exposure on a pattern of a higher degree of freedom and on a region of a figure in a short period of time.

The present invention provides a variable rectangle-type electron beam exposure apparatus for forming a rectangular beam of a different angle comprising: a first slit member having a pentagonal aperture in which two angles adjoining each other and one angle not adjoining these two angles are respectively formed into a right angle; a second slit member having a pentagonal aperture in which two angles adjoining each other and one angle not adjoining these two angles are respectively formed into a right angle, and a position of the right angle not adjoining the two right angles which adjoin each other is located at a position reverse to the position of the right angle not adjoining the two right angles of the first slit member by the angle 180°; and a deflecting member for deflecting an electron beam transmitted through the pentagonal aperture of the first slit so that the electron beam transmitted through the pentagonal aperture of the first slit can be partially transmitted through the pentagonal aperture of the second slit member and the other portions of the electron beam can be intercepted.

In this case, an electron beam can be changed by the deflecting member so that the electron beam transmitted through a peripheral region including a first angle or a second angle of the pentagonal aperture of the first slit member can be transmitted through a peripheral region including a first angle or a second angle of the pentagonal aperture of the second slit member so as to form a first rectangular electron beam and so that the electron beam transmitted through a peripheral region including a fourth angle of the pentagonal aperture of the first slit member can be transmitted through a peripheral region including a fourth angle of the pentagonal aperture of the second slit member so as to form a second rectangular electron beam in the case where the two angles adjoining each other are defined as the first angle and the second angle, and the angle not adjoining these two angles is defined as the fourth angle and in the case where the electron beam transmitted through the pentagonal aperture of the first slit member is partially transmitted through second slit member.

Further, the present invention provides a pattern exposure-formation method in which the variable rectangle-type electron beam exposure apparatus described in claim 8 is used, characterized in that: an exposure pattern is formed by combining a first exposure pattern with a second exposure pattern, wherein in the first exposure pattern, the exposure is conducted by shifting a first rectangular electron beam, little by little, which is formed when an electron beam transmitted through a peripheral region including the first angle or the second angle of the pentagonal aperture of the first slit member is transmitted through a peripheral region including the first angle or the second angle of the pentagonal aperture of the second slit member, and in the second exposure pattern, the exposure is conducted by shifting a second rectangular electron beam, little by little, which is formed when an electron beam transmitted through a peripheral region including the fourth angle of the pentagonal aperture of the first slit member is transmitted through a peripheral region including the fourth angle of the pentagonal aperture of the second slit member.

In the above variable rectangle-type electron beam exposure apparatus and the pattern exposure method, when the electron beams passing through the pentagonal apertures provided in the first and the second slit are appropriately combined with each other, the rectangular electron beams of different angles can be obtained. That is, when the first exposure pattern of a predetermined angle and the second exposure pattern of a different angle are combined with each other, the exposure can be conducted on a pattern of a higher degree of freedom or a region of a figure in a short period of time.

Further, the present invention provides a pattern exposure-formation method in which the variable rectangle-type electron beam exposure apparatus described above is used, characterized in that: when a continuous exposure pattern is formed by conducting exposure while a rectangle-type electron beam for irradiating a face to be exposed is being shifted a little, exposure is conducted while the exposure interval is set at 1/N pitch and each beam irradiation is set at a value lower than A, wherein one pitch is an exposure interval in the case where a side of the rectangle of the electron beam and a side of the rectangle of the electron beam to be exposed next are successively connected with each other under the condition that the regions to be exposed are not overlapped on each other, and an exposure interval is 1/N pitch in the case where an irradiation of each beam is set at A when exposure is conducted at the interval of one pitch. In this case, N>1.

In the case where exposure is conducted by putting variable rectangle-type beams on each other at the exposure interval of 1/N (N>1), for example, ½ pitch, when a beam irradiation of each beam is made to be smaller than each beam irradiation (dose) in the case of conducting exposure at the interval of one pitch, it is possible to prevent a swelling of the pattern at the edge portion of a pattern figure to be made. Therefore, it is possible to highly accurately make a pattern having a line width similar to an objective pattern figure.

Further, the present invention provides a pattern exposure-formation method in which the variable rectangle-type electron beam exposure apparatus described above is used, characterized in that: when a side of the pattern figure to be made before it is divided into rectangles or a side of the figure of the connecting end in the case of making by dividing a long linear pattern is exposed so that the side can be parallel with the side of the rectangle used for exposure, one redundant variable rectangle overlapping by ½ pitch so that the variable rectangle can be located across the sides of the figures is generated so as to make up for the contact portion. In this case, in the case where a triangle is made which has a side not parallel with the side of the variable rectangle used for exposure, exposure is conducted while the variable rectangles are put on each other by ½ pitch in the inner region of the triangle concerned.

When one redundant variable rectangle is generated which is put on the figure by ½ pitch so that the redundant variable rectangle can be located across the pattern figure to be made, a problem of the lack of accuracy at the connecting portion can be solved, and a pattern shape of this connecting portion can be made smooth.

BRIEF DESCRIPTION OF THE DRAWINGS

FIG. 8 is a view showing an example in which

DETAILED DESCRIPTION OF THE PREFERRED EMBODIMENTS

Referring to the accompanying drawings, embodiments of the present invention will be explained in detail as follows.

Figure 1:
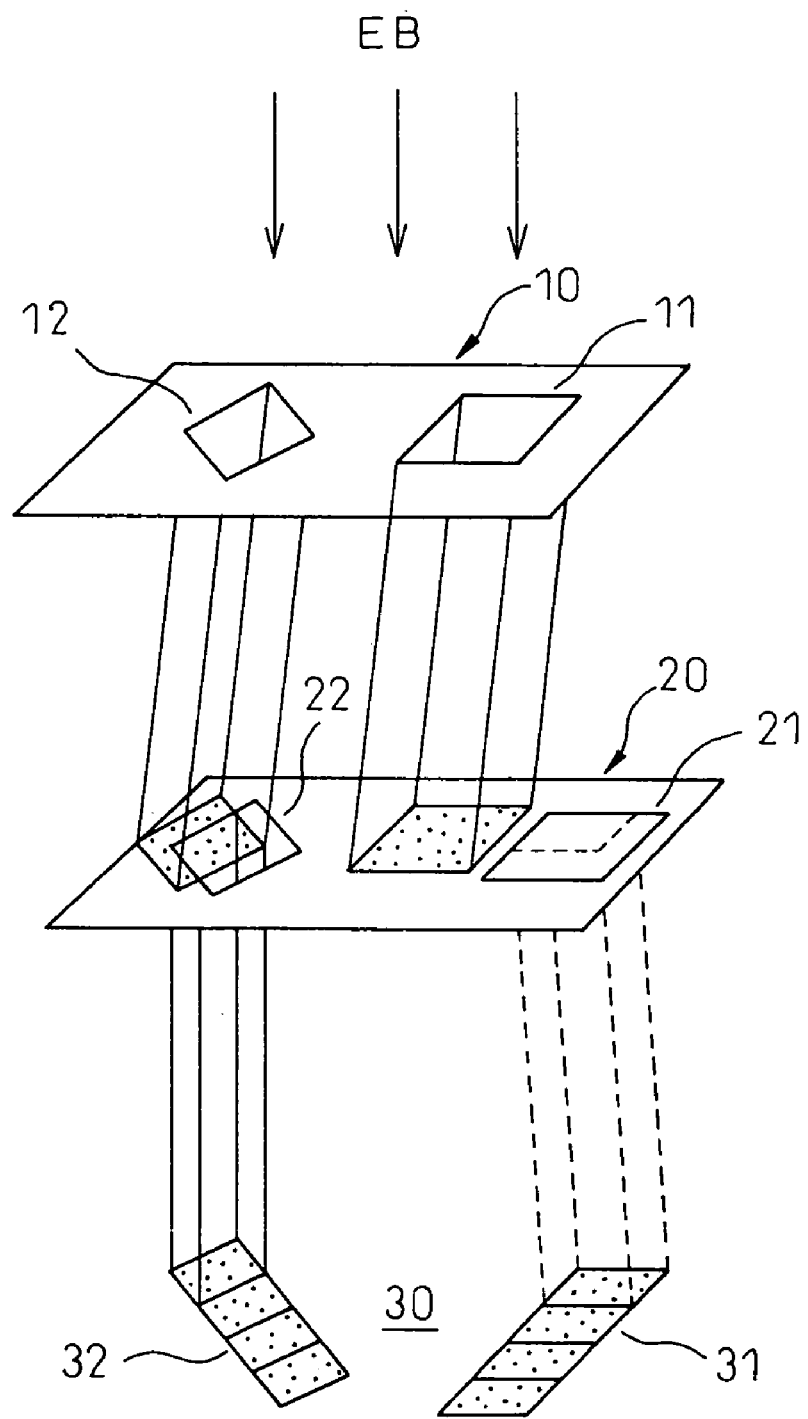
FIG. 1 is a perspective view showing the first embodiment of the variable rectangle-type electron beam exposure apparatus of the present invention.

FIG. 1 is a perspective view showing the first embodiment of the variable rectangle-type electron beam exposure apparatus of the present invention.

In the first slit member 10, which is formed into a flat-plate-shape, two apertures 11, 12 of the same size and shape are arranged and spaced from each other wherein these two apertures 11, 12 are directed in a different direction from each other by 45°. In the same manner, in the second slit member 20 (pattern block mask), which is formed into a flat-plate-shape, two apertures 21, 22 of the same size and shape are arranged and spaced from each other wherein these two apertures 21, 22 are directed in a different direction from each other by 45°. The first slit member 10 and the second slit member 20 are arranged in parallel with each other.

Each side of the first rectangular aperture 11 of the first slit member 10 is parallel with each side of the first rectangular aperture 21 of the second slit member 20. In the same manner, each side of the second rectangular aperture 12 of the first slit member 10 is parallel with each side of the second rectangular aperture 22 of the second slit member 20. In this connection, the aspect ratios of the rectangular apertures 11, 21 may be the same or different from each other. The aspect ratios of the rectangular apertures 12, 22 may be also the same or different from each other.

Electron beam EB is irradiated, for example, from the direction perpendicular to the first slit member 10. Electron beam EB transmitted through the first aperture 11 and the second aperture 12 of the first slit member 10 is deflected by a deflecting member not shown in FIG. 1.

When electron beam EB transmitted through the first aperture 11 and the second aperture 12 of the first slit member 10 is deflected, for example, in the predetermined direction illustrated in the drawing, electron beam EB transmitted through the first aperture 11 of the first slit 10 is intercepted by the second slit member 20. On the other hand, electron beam EB transmitted through the second aperture 12 of the first slit member 10 is partially transmitted through the second aperture 22 of the second slit member 20 and forms a predetermined rectangular pattern 32 on the object 30 such as a master board of a disk medium. When the same rectangular pattern 32 is continuously exposed in order to be connected with each other, it is possible to form a pattern directed in the predetermined direction.

In the case where electron beam EB transmitted through the first aperture 11 and the second aperture 12 of the first slit member 10 is deflected in the other direction, for example, electron beam EB transmitted through the first aperture 11 of the first slit member 10 is partially transmitted through the first rectangular aperture of the second slit member 20. On the other hand, electron beam EB transmitted through the second aperture 12 of the first slit member 10 is intercepted by the second slit member 20. In this case, the rectangular pattern 31, the angle of which is different from that of the rectangular pattern 32 by 45°, is formed on the object 30. When the same rectangular pattern 31 is continuously exposed to be connected with each other, it is possible to form a pattern directed in a different direction. In this case, the direction is different by 45°.

Figure 2:
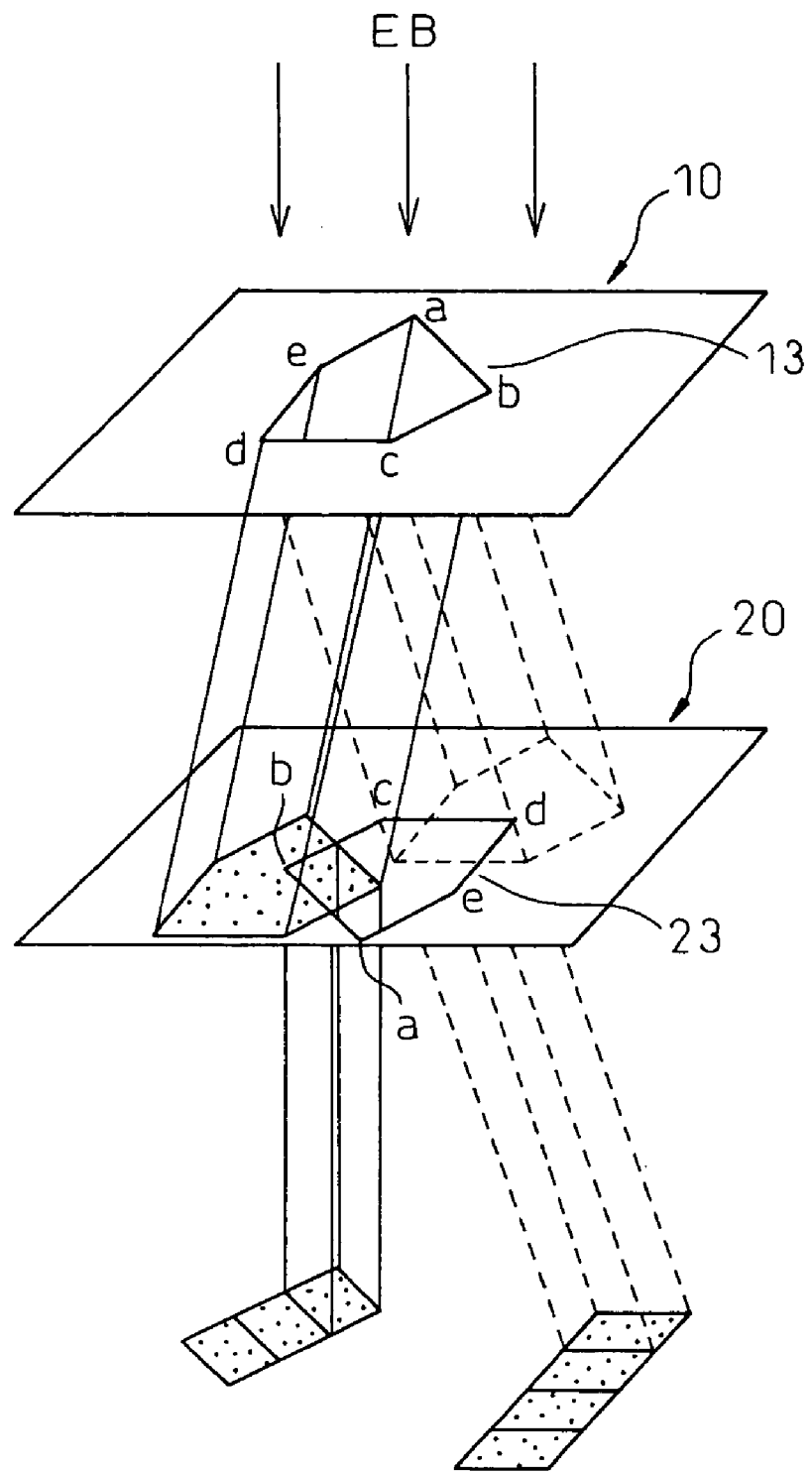
FIG. 2 is a perspective view showing the second embodiment of the variable rectangle-type electron beam exposure apparatus of the present invention.
Figure 3A:
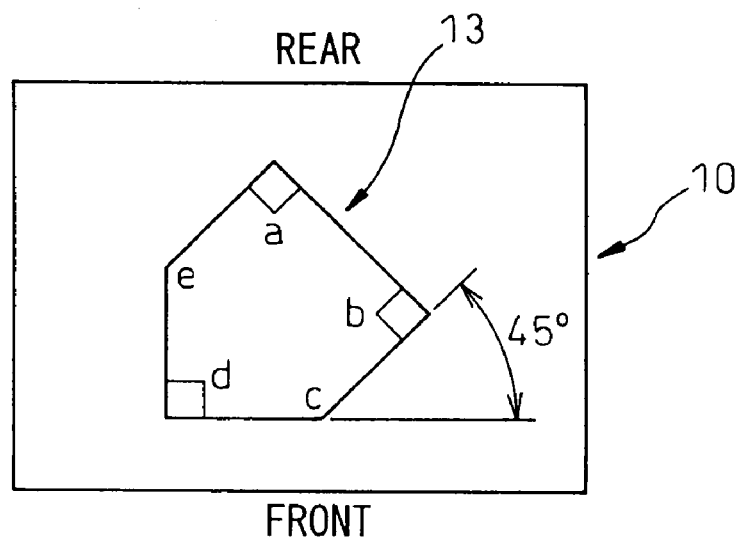
FIGS. 3(a) and 3(b) are plan views showing slit members used for the second embodiment of the variable rectangle-type electron beam exposure apparatus of the present invention.
Figure 3B:
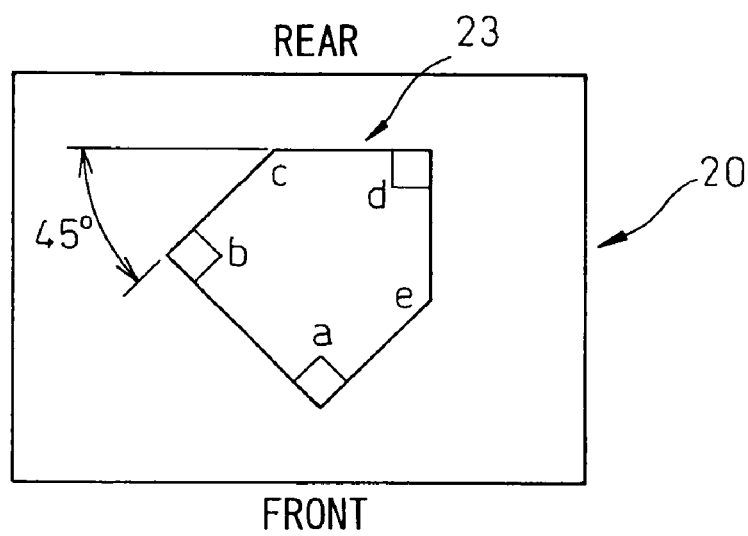
Figure 4:
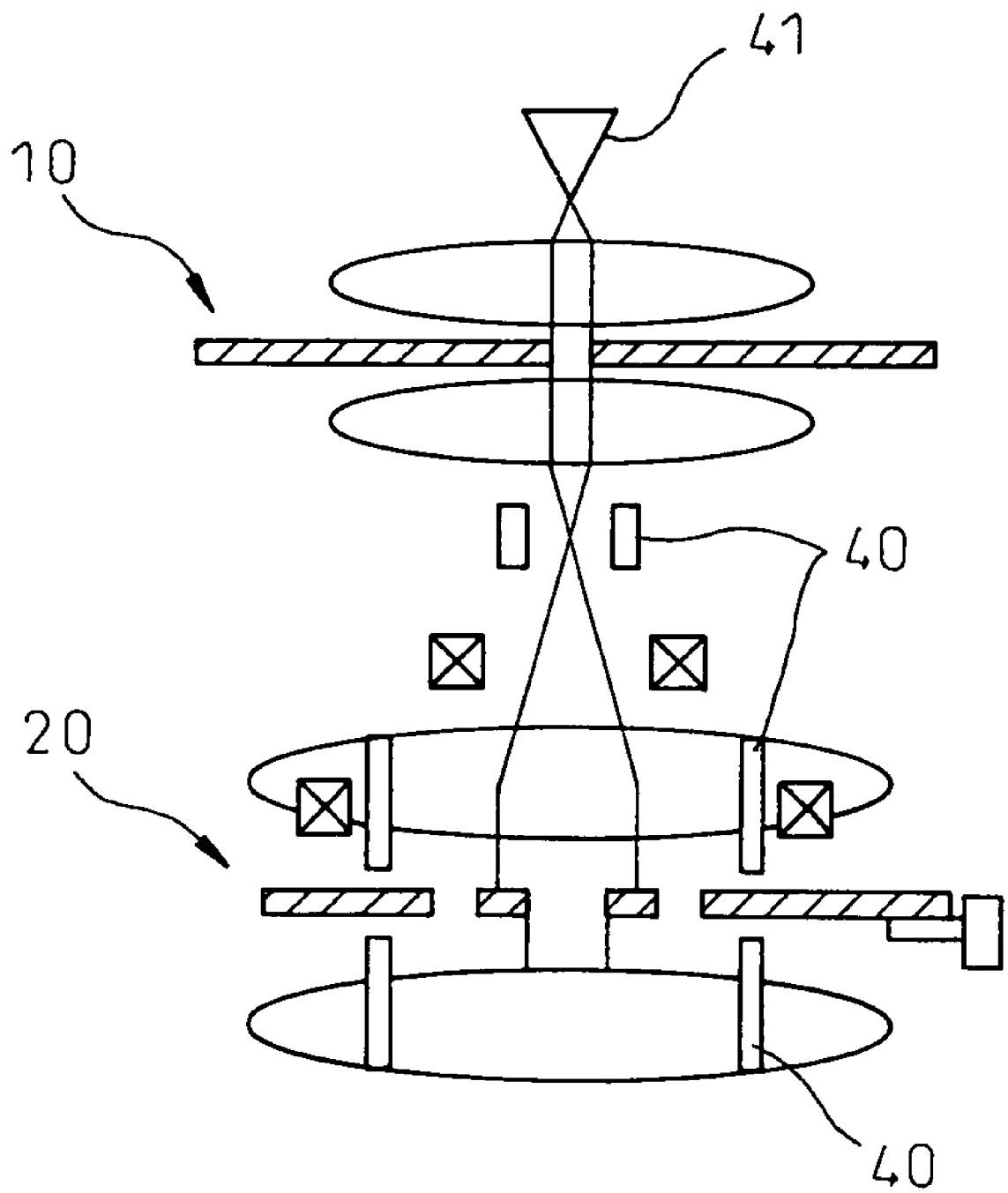
FIG. 4 is a view showing an outline of the second embodiment of the variable rectangle-type electron beam exposure apparatus of the present invention.

FIG. 2 is a perspective view showing the second embodiment of the variable rectangle-type electron beam exposure apparatus of the present invention, FIGS. 3(a) and 3(b) are plan views showing shapes of the pentagonal aperture formed in the slit member, and FIG. 4 is a view showing an outline of the exposure apparatus of the this embodiment.

As shown in FIG. 3(a), one pentagonal aperture 13 is formed in the first slit member 10, the shape of which is a flat-plate-shape. This pentagon is formed in such a manner that the two angles "a" and "b" adjoining each other and the angle "d" not adjoining these two angles are respectively formed into 90°, and the residual two angles "c" and "e" are respectively formed into 135°, that is, this pentagon is formed into a "base" shape, such as that used in baseball game.

As shown in FIG. 3(b), one pentagonal aperture 23 is formed in the second slit member (pattern block mask) 20, the shape of which is a flat-plate-shape, which is arranged in parallel with the first slit member 10. In the same manner as that described before, this pentagon is formed in such a manner that the two angles "a" and "b" adjoining each other and the angle "d" not adjoining these two angles are respectively formed into 90°, and the residual two angles "c" and "e" are respectively formed into 135°, that is, this pentagon is formed into a "base" shape, such as that used in baseball game.

Sides "ab" of the two pentagonal apertures 13, 23 are parallel with each other. Further, sides "bc" and "ea" of the two pentagonal apertures 13, 23 are parallel with each other. However, the corner "d" of the pentagonal aperture 13 and the corner "d" of the pentagonal aperture 23 are located on the opposite side to each other with respect to the sides "ab".

Electron beam EB is irradiated, for example, in the direction perpendicular to the first slit member 10. Electron beam EB transmitted through the pentagonal aperture 13 of the first slit member 10 is deflected by the deflecting member 40 shown in FIG. 4.

When electron beam EB transmitted through the pentagonal aperture 13 of the first slit member 10 is deflected in a predetermined direction, for example, by the mask selection deflecting member 40 shown in FIG. 4, the deflected electron beam EB is partially transmitted through the pentagonal aperture 13 of the second slit member 20. In this case, the electron beam transmitted through a peripheral region including the second angle "b" of the pentagonal aperture 13 of the first slit member 10 is transmitted through a peripheral region of the second angle "b" of the pentagonal aperture 23 of the second slit member 20, so that the predetermined rectangular pattern 32 can be formed on the object 30. When the same rectangular pattern 32 is continuously exposed to be connected with each other, it is possible to form a pattern directed in a predetermined direction.

When electron beam EB transmitted through the pentagonal aperture 13 of the first slit member 10 is deflected in the other direction by the deflecting member 40, the electron beam is partially transmitted through the pentagonal aperture 13 of the second slit member 20. In this case, the electron beam transmitted through a peripheral region including the fourth angle "d" of the pentagonal aperture 13 of the first slit member 10 is transmitted through a peripheral region of the fourth angle "d" of the pentagonal aperture 23 of the second slit member 20, so that the predetermined rectangular pattern 31, the angle of which is different from that of the rectangular pattern 32 by 45°, can be formed on the object 30. When the same rectangular pattern 31 is continuously exposed to be connected with each other, It is possible to form a pattern directed in a different direction (a direction different by 45°).

Figure 5:
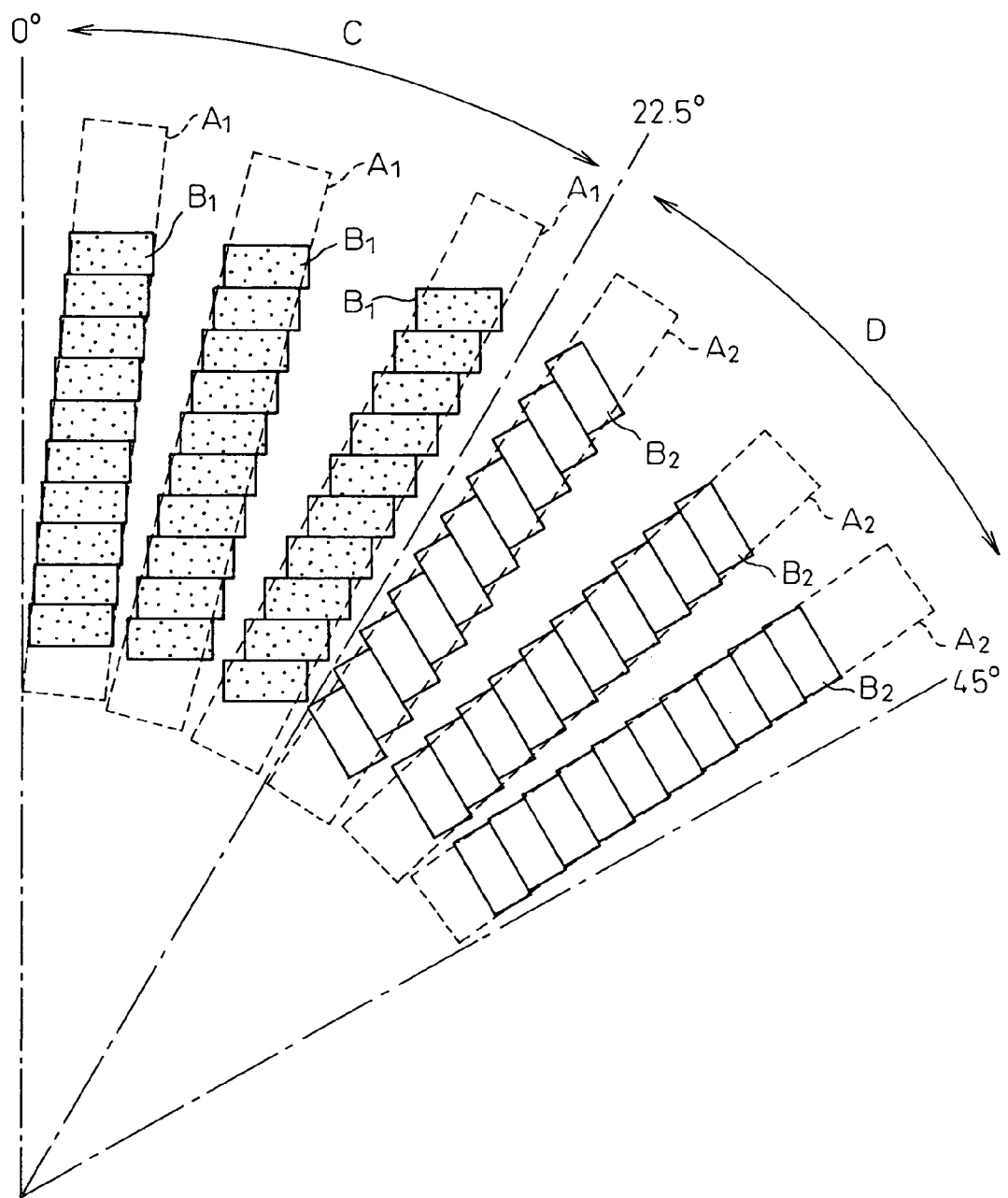
FIG. 5 is a view showing an example of the exposure pattern conducted by a variable rectangular electron beam (0° and 45°)

FIG. 5 is a view showing an example of the case in which the exposure is conducted by the variable rectangle-type electron beam exposure apparatus of the first or the second embodiment described before. This is an example of the linear pattern exposure of an arbitrary angle conducted by using a variable rectangle having an angle (0° or 45°). For example, in the case where the servo information pattern of a disk-shaped magnetic recording medium has a shape in which a large number of fine patterns having a predetermined width with respect to a circular region are radially extended, the rectangular electron beams of 0° and 45° are selectively used. In this case, the rectangular electron beams are properly used with respect to the border of the intermediate angle (22.5°). In the case of forming fine patterns $A_1$, $A_1$ . . . which are in region C of 0°±22.5°, rectangular electron beam $B_1$ of 0° is used. In the case of forming fine patterns $A_2$, $A_2$ . . . which are in region D of 45°±22.5°, rectangular electron beam $B_2$ of 45° is used. In the case of the other angle regions, since it is symmetrical with respect to 0° or 45°, a rectangular electron beam of the corresponding angle is used.

Another example will be explained as follows. In the case where the variable rectangle having an angle is properly use at the three stages of 0°, 30° and 60°, the angle region of 0°±15° is exposed by the rectangular electron beam of 0° with respect to the pattern, the angle region of 30°±15° is exposed by the rectangular electron beam of 30° with respect to the pattern, and the angle region of 60°±15° is exposed by the rectangular electron beam of 60° with respect to the pattern. In the angle range except for that, since it is symmetrical with respect to 0°, 30° and 60°, the rectangular electron beam of the corresponding angle is used. When the rectangular patterns of three stages are used as described above, finer patterns can be formed.

Figure 6:
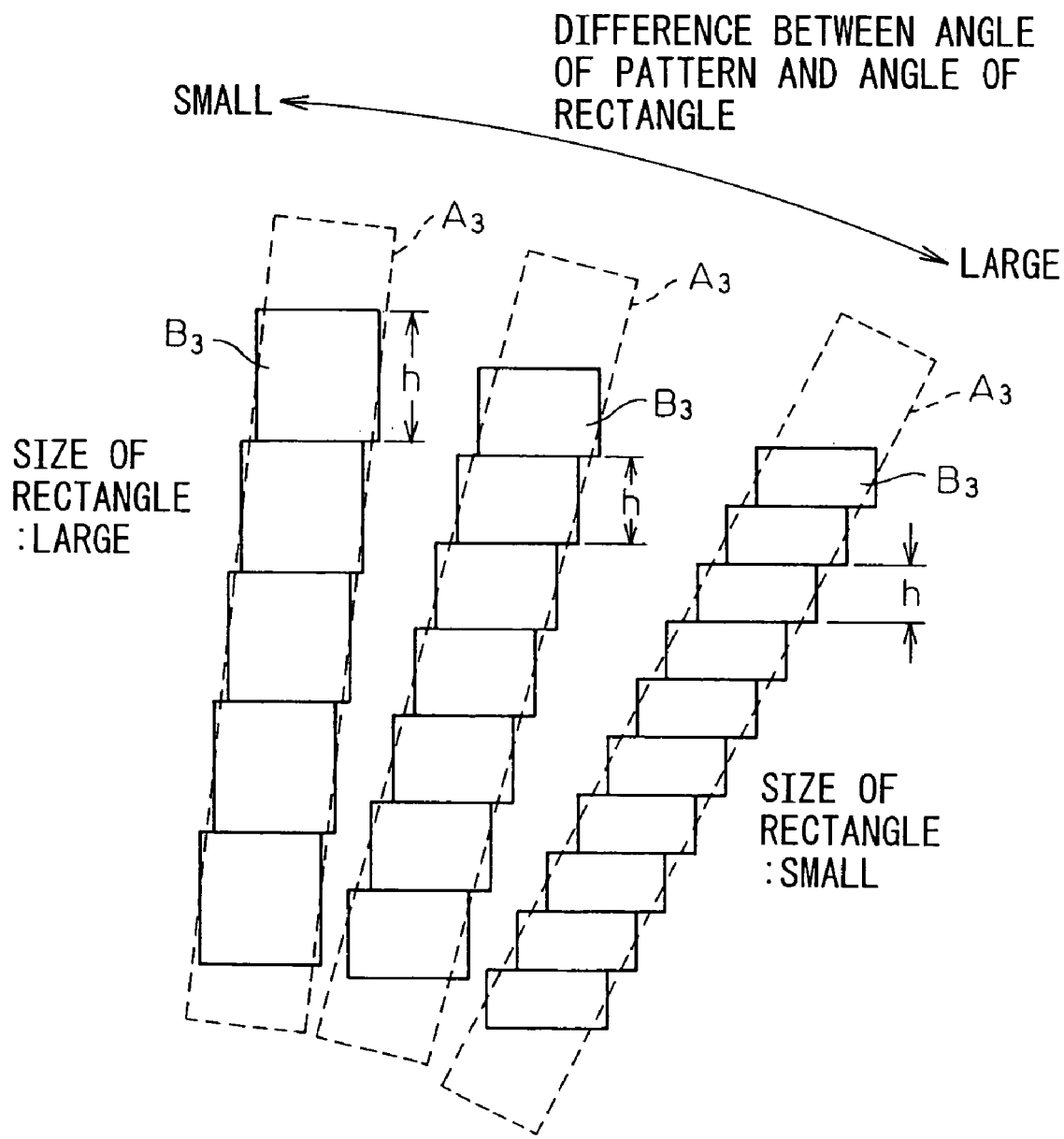
FIG. 6 is a view showing an example in which the exposure is conducted while the size of a rectangular electron beam is changed.

FIG. 6 is a view showing an example in which the rectangular size $B_3$, $B_3$, ... of the variable rectangle having an angle is changed according to the angle of the fine line pattern $A_3$, $A_3$, ... to be exposed. In the case where a difference between the rectangular angle to be used and the angle of the linear pattern is small, when the size (in the direction of height in FIG. 6) in the direction of the pattern length is increased as shown in the drawing, the number of shots of exposure can be reduced. As the period of time necessary for exposing one rectangle is the same due to the property of the variable rectangle-type electron beam exposing machine, the smaller the number of shots is, the move the exposure time is reduced. On the other hand, in the case where a difference between the rectangular angle to be used and the linear pattern angle to be made is large, the size (in the direction of height in FIG. 6) of the rectangular pattern is reduced. In this case, although the number of shots is increased, the exposure can become close to the shape of the pattern.

Figure 7A:
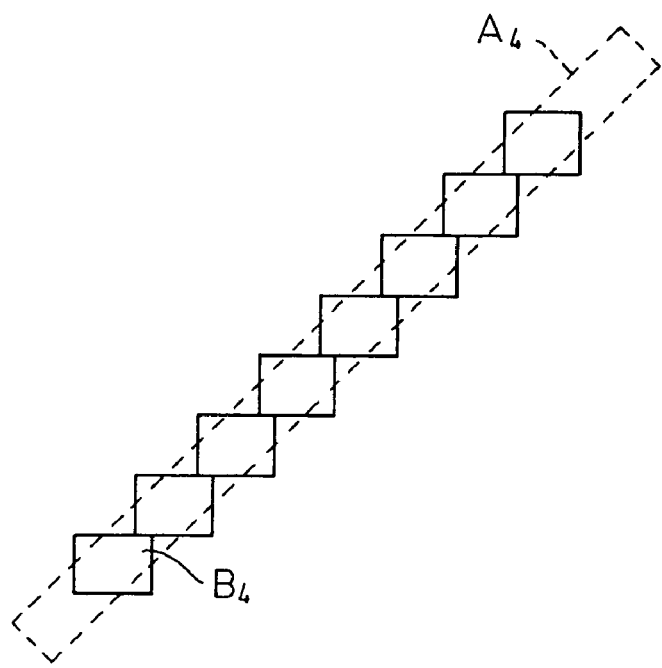
FIGS. 7(a) and 7(b) are views showing examples in which the overlapping exposure is conducted.
Figure 7B:
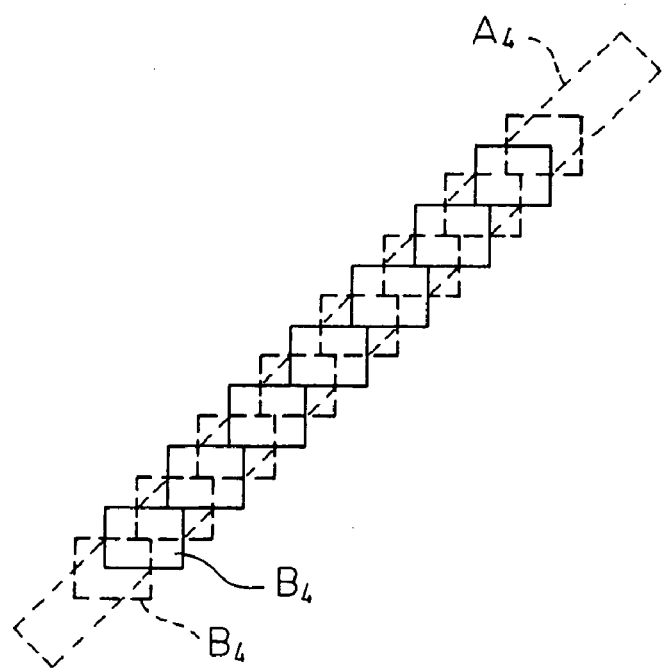

FIG. 7 is a view showing an example of conducting an overlapping exposure. In the case where a variable rectangular linear pattern having an angle is exposed, when the rectangular size is made to be sufficiently fine with respect to the line width, it is possible to make a smooth oblique line. However, in the case where a very fine linear pattern is exposed, even when the variable rectangular electron beam exposing machine is used, the smallest size capable of being exposed is limited. In the pattern close to the lower limit of the fine line width, the size of the rectangle to be used for it comes close to the lower limit. Therefore, as shown in FIG. 7(*a*), it is impossible to sufficiently reduce the size of the exposure rectangle $B_4$ with respect to the line width of the pattern $A_4$ to be made. Therefore, the line cannot be made sufficiently smooth. On the other hand, when the overlapping exposure $B_4$, $B_4$ is conducted as shown in FIG. 7(*b*), it becomes possible to make a smoother pattern. That is, for the property of resist, when the exposure development is conducted, it is possible to form a pattern smoother than the pattern shown in FIG. 7(*b*).

In the case where exposure is conducted while the electron beams are put on each other by ½ pitch as shown in FIG. 7, unless a beam irradiation, which will be referred to as a dose hereinafter, at the individual overlapping portion is adjusted, the dose in the portion where exposure has been conducted twice is a sum of the doses of the individual variable rectangles, that is, the dose is twice as large as that of each variable rectangle. When the pattern is exposed by the dose larger than the normal value, the shape of the exposed pattern is swelled. Accordingly, it becomes impossible to form a pattern having an objective line width. Therefore, in the present invention, in the case of conducting exposure being put on each other by ½ pitch, the dose of the overlapped variable rectangle is reduced to ½. Due to the foregoing, the shape of the exposed pattern is not swelled. Therefore, it becomes possible to obtain a pattern having an objective line width at high accuracy.

In general, in the case where exposure is conducted at the pitch of 1/N (N>1), the dose in the overlapping portion is made to be smaller than the dose (A) in the case of conducting exposure at one pitch, for example, exposure is conducted at the pitch of A/N. Due to the foregoing, it is possible to obtain a pattern having an highly accurate objective line width.

Figure 8:
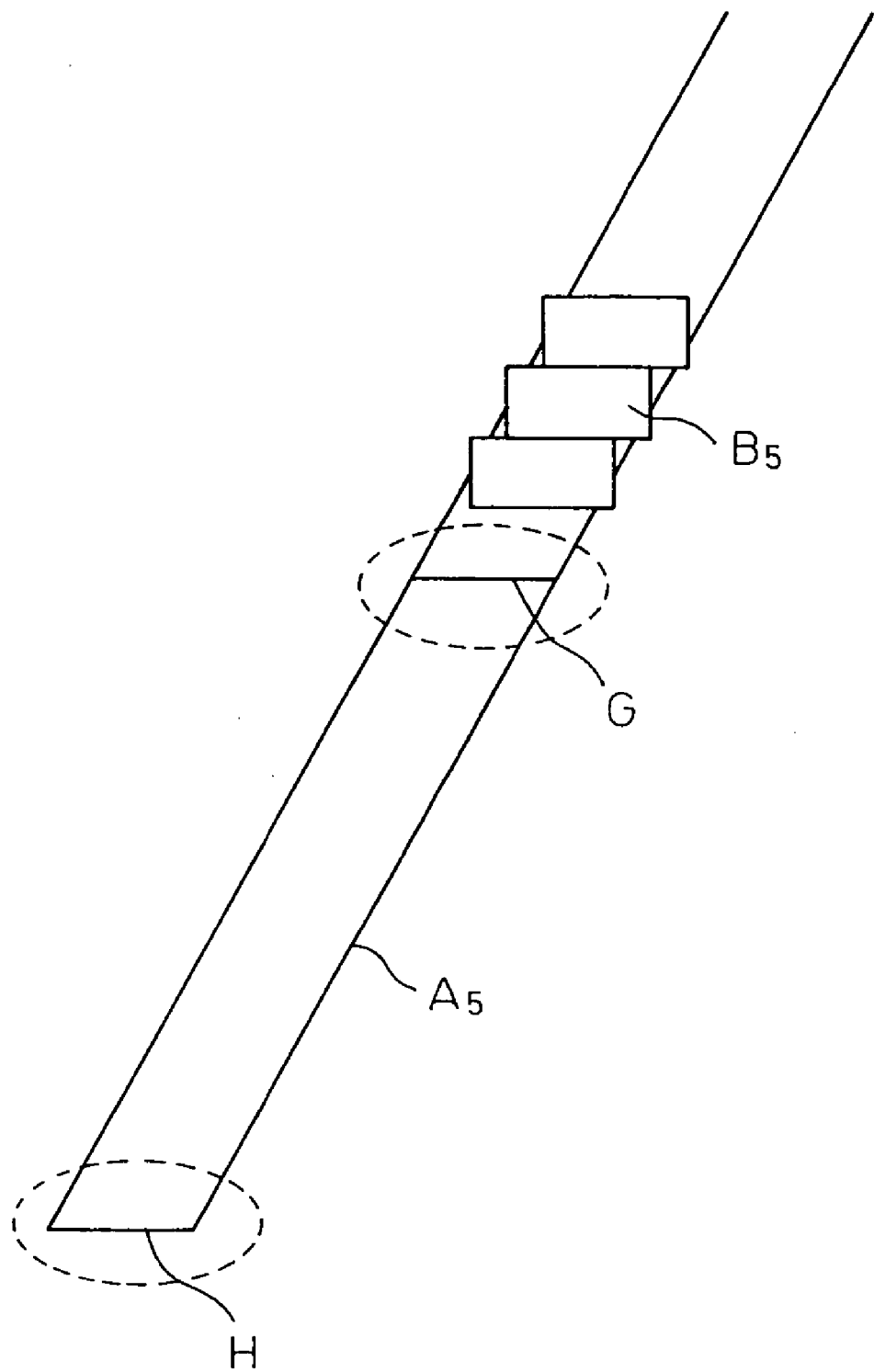

FIG. 8 is a view showing an example in which an end portion of the thin line pattern $A_5$ is effectively processed in the case where no restrictions are placed. When the connection end G made in the case of dividing a long line or the end H of a figure is made parallel with the side of the rectangle $B_5$ used for exposure, it becomes unnecessary to make small rectangles which are not needed. Therefore, exposure can be effectively conducted.

As shown in FIG. 8, in the case where the thin line pattern $A_5$ is formed by continuously connecting parallelograms under the condition that the sides are being contacted with each other and the connecting end G of the pattern is made to agree with the side of the rectangle $B_5$ used for exposure, of course, it is possible to conduct exposure being overlapped with each other at ½ pitch in the same manner as that shown in FIG. 7.

Figure 9A:
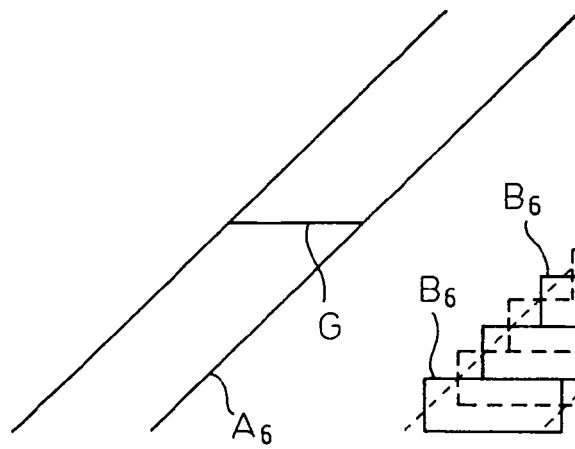
FIG. 9 is a view showing a state of exposure at the connection end in the case of exposure of overlapping.
Figure 9B:
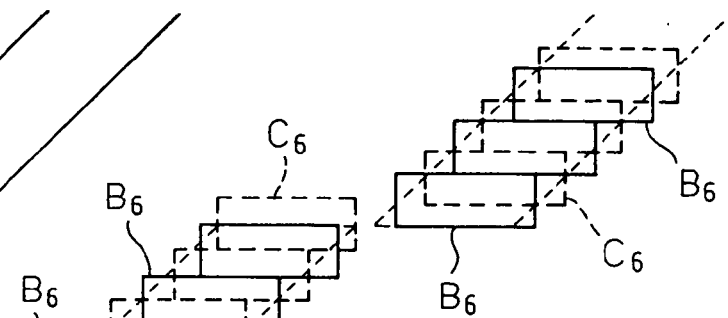

FIG. 9 is a view showing a method of exposure at the connecting end G in the case of exposing being overlapped by ½ pitch. At the connecting end G of the objective parallelogram pattern, an upper side of the rectangle $B_6$ used for exposure is made to agree with the connecting end G. However, at the connecting portion, a redundant variable rectangle $C_6$, which is overlapped at ½ pitch, is generated being located across the connecting end G. Due to the foregoing, even in the connecting portion G, the same variable rectangle, which is shifted by ½ pitch, can be formed in the pattern. Therefore, even in the connecting portion G, it is possible to form a smooth pattern.

In the case where exposure is restarted by the variable rectangle-type beam at the connecting end G of the parallelogram pattern, exposure is started so that a lower side of the variable rectangle $B_6$ can agree with the connecting end G. Successively, exposure is conducted so that the sides of the variable rectangle $B_6$ can be contacted with each other. Exposure is also conducted while the variable rectangle $C_6$, which is shifted from the variable rectangle $B_6$ by ½ pitch, is being overlapped.

Figure 10:
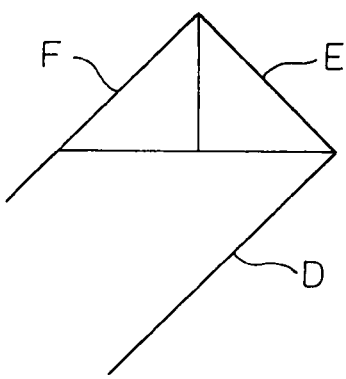
FIG. 10 is a view showing a state of exposure of the triangular portion.
Figure 11A:
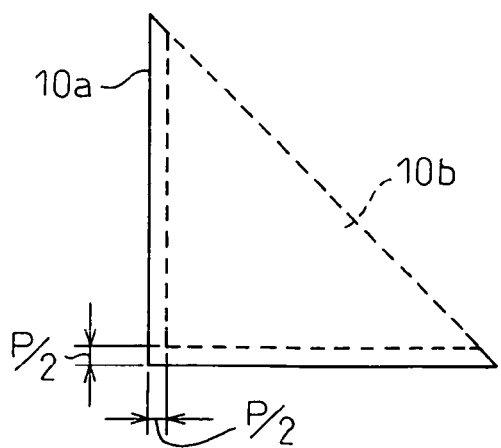
FIG. 11 is a view showing a state in which exposure of overlapping is conducted on the triangular portion.
Figure 11B:
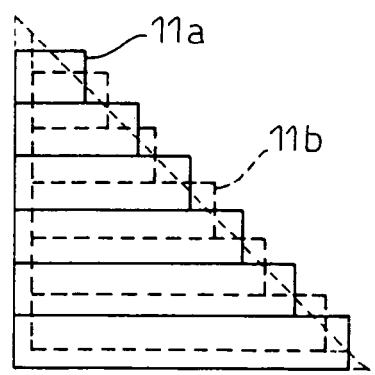

FIGS. 10 and 11 are views showing a case in which a triangle portion is exposed. In the case where a pattern figure to be made is a rectangle and the side is approximately horizontal or vertical with respect to the shape of the variable rectangle-type beam, as explained in FIG. 8, it is possible to cut the forward end portion horizontally or vertically so as to eliminate a fine variable rectangle which is not needed. However, in the case where the side of the variable rectangle-type beam is about 45° with respect to the side of the pattern figure to be made, it can not be a fine figure but it must be a combination of the portion D of the parallelogram with the portions of the triangles E, F as shown in FIG. 10. As proposed here, with respect to these triangles E, F, exposure is conducted after the variable rectangle is divided. In this case, in the same manner as that of the parallelogram, in the case of the triangle, a large number of variable rectangles are generated according to the length of the side of the triangle and the oblique side in the same manner as that of the parallelogram.

As shown in FIG. 11(*a*), with respect to the original right-angled triangle pattern 10*a*, the triangle 10*b*, which is shortened by ½ pitch (P/2) of the variable rectangle-type beam, is arranged and put so that the oblique face can be fitted. As shown in FIGS. 10(*b*), when the variable rectangles 11*a*, 11*b*, which are respectively generated from the triangles 10*a*, 10*b*, are arranged in the positional relation in which the positions of the variable rectangles are shifted by ½ pitch, even in the case of exposure of overlapping, the pattern shape is not swelled especially at the edge portion of the figure. Therefore, a smooth pattern similar to the objective triangle can be made.

Figure 12:
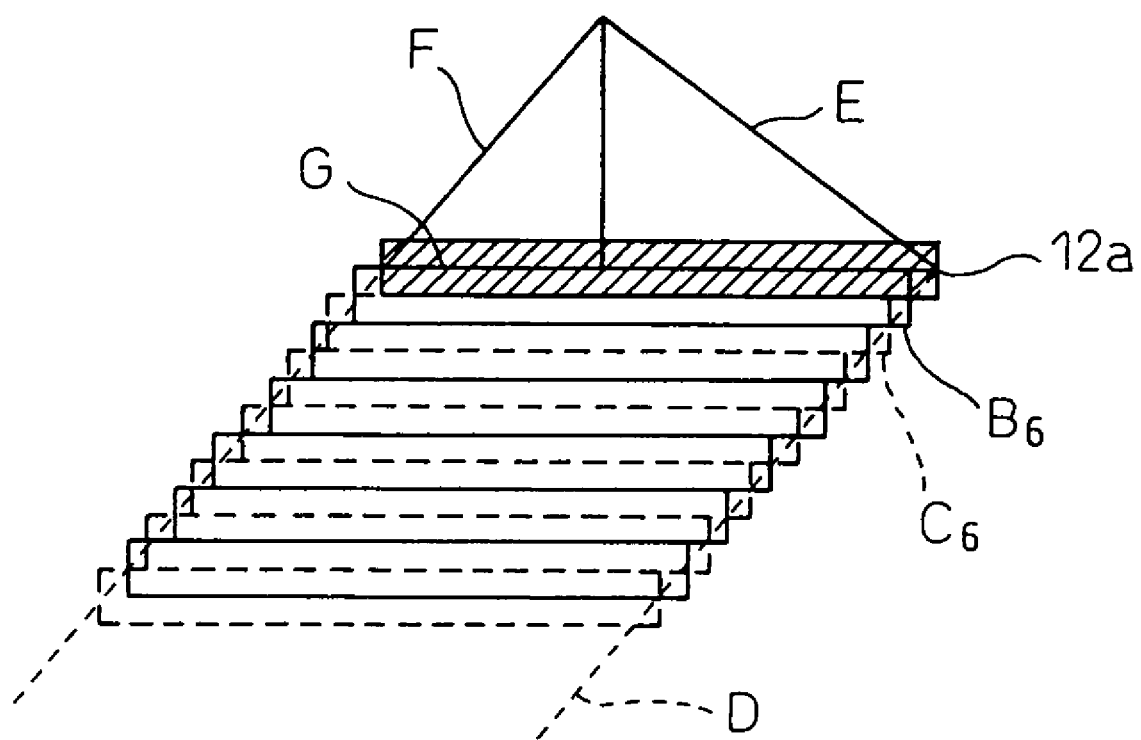
FIG. 12 is a view showing a state of exposure of a portion in which a parallelogram and a triangle are combined with each other.

FIG. 12 is a view showing a method of exposure of the portion of the parallelogram D in the pattern shape in which the parallelogram D and the triangles E, F shown in FIG. 10 are combined with each other. In the connecting portion of the parallelogram portion with the triangle portion, one redundant variable rectangle is generated in the same manner. That is, in FIG. 12, in order to make up for the lack in the connecting portion G of the parallelogram D with the triangle portions E, F, one redundant variable rectangle 12a is generated and arranged being located across the parallelogram portion D and the triangle portions E, F.

Figure 13A:
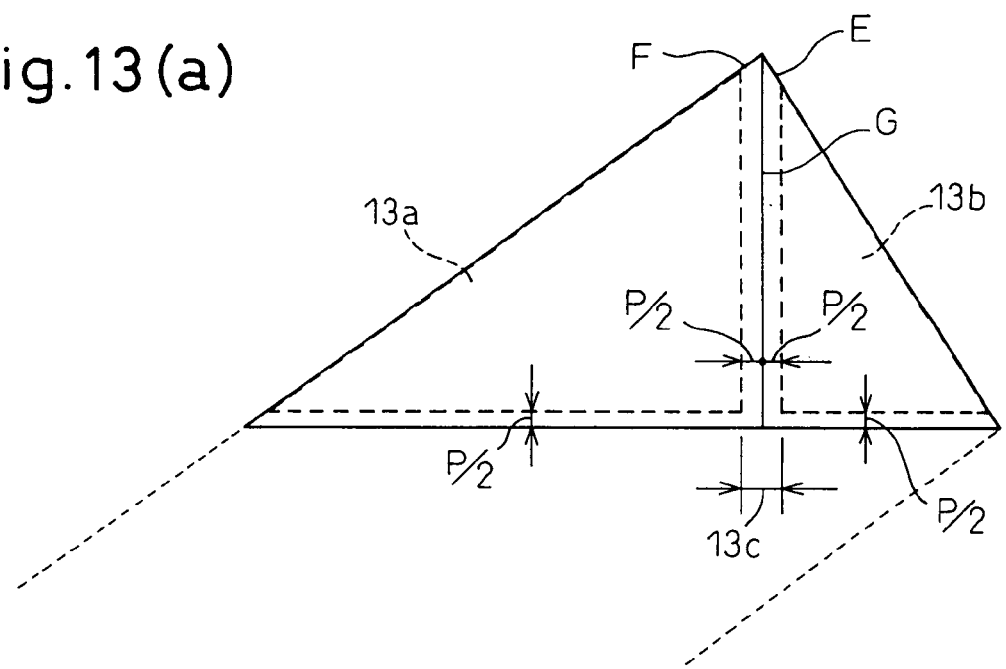
FIG. 13 is a view showing a state in which a triangle portion is divided and subjected to exposure of overlapping.
Figure 13B:
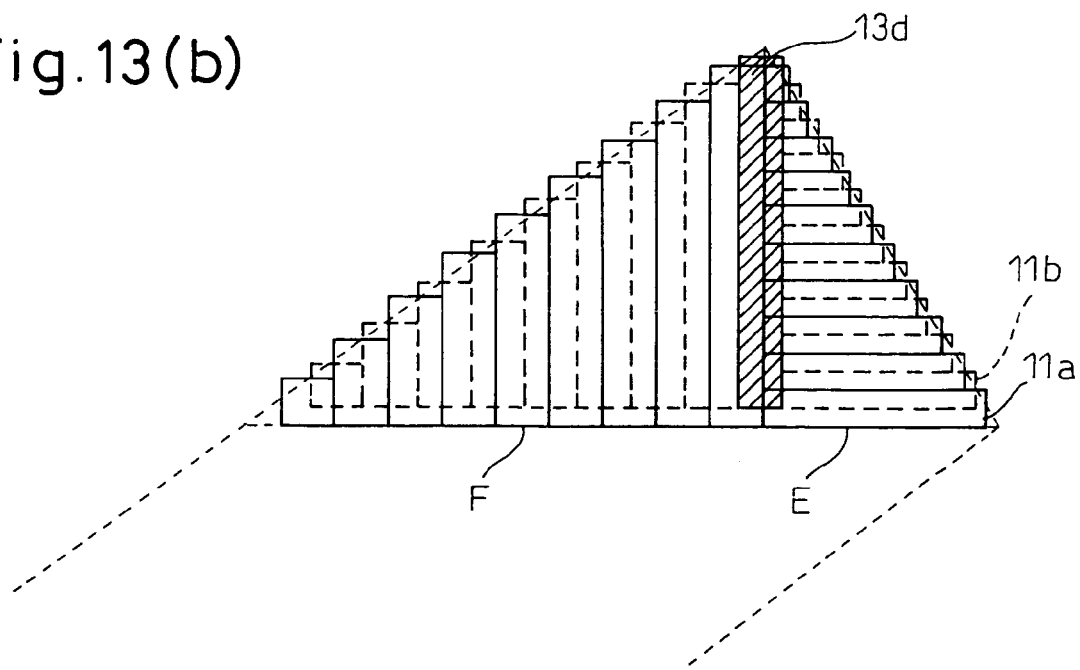
Figure 14:
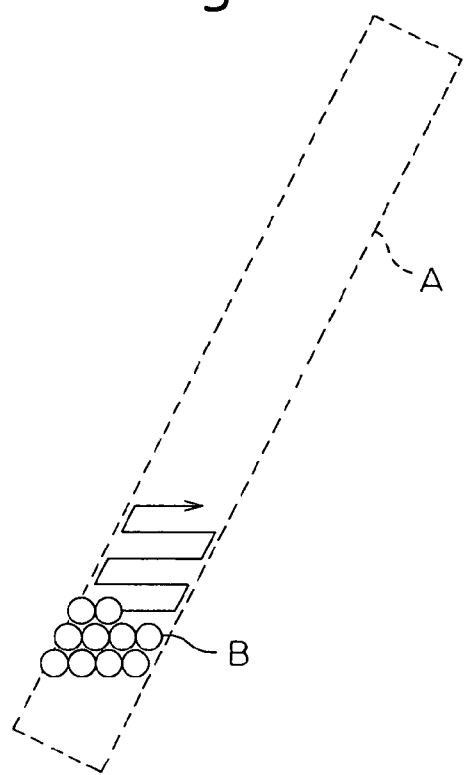
FIG. 14 is a view showing a state of exposure conducted by a conventional point beam.
Figure 15:
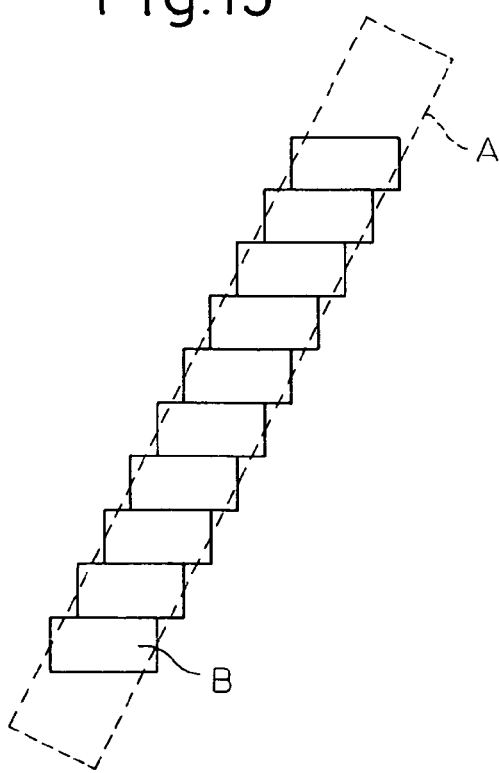
FIG. 15 is a view showing a state of exposure conducted by a conventional rectangular beam.

FIG. 13 is a view showing a case in which the triangle portion is further divided into two triangle portions E, F, and the exposure pattern is formed in each triangle portion E, F. In order to make up for the lack in the connecting portion G of the two triangle portions E, F shown in FIG. 13(a), the triangles 13a, 13b, which are shortened by ½ pitch of the variable rectangle-type beam with respect to the triangles E, F, are arranged so that the oblique faces can agree with each other, and the variable rectangle 13d shown in FIG. 13(b) having the same width (the width of one pitch) as the lacking width 13c is generated. Due to the foregoing, in the same manner as that described before, it is possible to form an exposure pattern in which the problem of lack of accuracy in the connecting portion G of two triangles E, F can be solved. In this connection, with respect to each triangle E, F in FIG. 13(d), exposure can be conducted in the same manner as that shown in FIG. 11. With respect to the triangle E, exposure is conducted while the variable rectangle-type beams are successively put on each other in the vertical direction. With respect to the triangle F, exposure is conducted while the variable rectangle-type beams are successively put on each other in the horizontal direction.

For example, an actual shape of the disk recording medium is formed by rotating a rectangle. Therefore, as described before, depending upon an angle, a triangle (a trapezoid) composing a corner portion of the rectangle must be exposed in some cases. Therefore, making the triangle portion by the exposure of overlapping is especially effective for the use described above.

Embodiments of the present invention have been explained above referring to the accompanying drawings. However, it should be noted that the present invention is not limited to the above specific embodiments. Variations may be made by those skilled in the art without departing from the spirit and scope of the present invention.

For example, when the case shown in FIG. 5 in which rectangle beam $B_1$, $B_2$, ... and rectangle beam $B_2$, $B_2$, ... of different angle are properly used between pattern $A_1$, $A_2$, ... and pattern $A_2$, $A_2$, ... of a different angle and the case shown in FIG. 6 in which the rectangular beam size is changed according to the angle of pattern $A_3$, $A_3$, ... to be formed are combined with each other, it becomes possible to realize a precise exposure according to the pattern to be formed. That is, in FIG. 5, in the case where the rectangular pattern of 0° is used in region C, the pattern angle of which is 0°±22.5°, the rectangular pattern, the height h of which is large, is used in the region close to 0° in the same region C, and the rectangular pattern, the height h of which is small, is used in the region close to ±22.5° in the same region C.

In the same manner, when the exposure system shown in FIG. 5 and the double exposure system shown in FIG. 7 are appropriately combined with each other, it becomes possible to form a highly precise exposure pattern.

INDUSTRIAL APPLICABILITY

As explained above, according to the present invention, a plurality of apertures, the angles of which are different from each other, are provided in the first and the second slit member, and the exposure can be conducted by an electron beam passing through one of the sets of apertures. Therefore, when the angle, size and shape of the rectangular electron beam, which are suitable for the angle and shape of the pattern to be exposed and formed, are selected, the pattern or the region of a figure can be exposed and formed according to the shape of the pattern, with a high degree of freedom, in a short period of time.

The invention claimed is:

1. A variable rectangle-type electron beam exposing apparatus for forming rectangular beams of different angle comprising:
   a first slit member in which a plurality of rectangular apertures are respectively arranged by different angles;
   a second slit member in which a plurality of rectangular apertures, which are respectively positioned in parallel with the corresponding rectangular apertures of the first slit member, are arranged; and
   a deflecting unit for deflecting an electron beam, which has been transmitted through a plurality of apertures of the first slit member, so that, when the electron beam transmitted through the first aperture of the first slit member passes through the corresponding first aperture of the second slit member, the electron beam transmitted through the apertures other than the first aperture of the first slit member can be intercepted by the second slit member, and, when the electron beam transmitted through the second aperture of the first slit passes through the corresponding second aperture of the second slit member, the electron beam transmitted through the other apertures than the second aperture of the first slit member can be intercepted by the second slit member.

2. A variable rectangle-type electron beam exposing apparatus according to claim 1, wherein the first and the second slit members are formed into flat-plate shapes and are arranged in parallel with each other.

3. A variable rectangle-type electron beam exposing apparatus according to claim 1, wherein the first and the second apertures of the first and the second slit members are formed into the same-sized rectangles and are arranged in such a manner that the first and the second apertures define an angle of 45° with respect to each other.

4. A variable rectangle-type electron beam exposing apparatus according to claim 1, wherein the first aperture of the first slit member and that of the second slit member are similar to each other, and the second aperture of the first slit member and that of the second slit member are also similar to each other.

5. A pattern exposure-formation method, in which the variable rectangle-type electron beam exposing apparatus described in claim 1 is used, comprising the step of forming an exposure pattern by combining a first exposure pattern with a second exposure pattern, wherein the first exposure pattern is formed by slightly shifting a rectangular electron beam formed when an electron beam transmitted through the first aperture of the first slit member is also transmitted through the first aperture of the second slit member, and the second exposure pattern is formed by slightly shifting a rectangular electron beam formed when an electron beam transmitted through the second aperture of the second slit member is also transmitted through the second aperture of the second slit.

6. A pattern exposure and formation method according to claim 5, wherein a shape, an aspect ratio, or a size of each rectangular electron beam of the first and the second exposure patterns is changed according to a predetermined pattern shape, such as an angle or width thereof, to be formed.

7. A variable rectangle-type electron beam exposure apparatus for forming rectangular beams of different angle comprising:
   a first slit member having a pentagonal aperture in which two angles adjoining each other and one angle not adjoining these two angles are respectively formed into a right angle;
   a second slit member having a pentagonal aperture in which two angles adjoining each other and one angle not adjoining these two angles are respectively formed into a right angle, and a position of the right angle not adjoining the two right angles which adjoin each other is located at a position reverse to the position of the right angle not adjoining the two right angles of the first slit member by the angle 180°; and
   a deflecting member for deflecting an electron beam transmitted through the pentagonal aperture of the first slit so that the electron beam transmitted through the pentagonal aperture of the first slit can be partially transmitted through the pentagonal aperture of the second slit member and the other portions of the electron beam can be intercepted.

8. A variable rectangle-type electron beam exposure apparatus according to claim 7, wherein an electron beam can be changed over by the deflecting member, so that, in the case where the two angles adjoining each other are defined as the first angle and the second angle, and the angle not adjoining these two angles is defined as the fourth angle, and in the case where the electron beam transmitted through the pentagonal aperture of the first slit member is partially transmitted through second slit member,
   the electron beam transmitted through a peripheral region including a first angle or a second angle of the pentagonal aperture of the first slit member can be transmitted through a peripheral region including a first angle or a second angle of the pentagonal aperture of the second slit member so as to form a first rectangular electron beam, and
   the electron beam transmitted through a peripheral region including a fourth angle of the pentagonal aperture of the first slit member can be transmitted through a peripheral region including a fourth angle of the pentagonal aperture of the second slit member so as to form a second rectangular electron beam.

9. A variable rectangle-type electron beam exposure apparatus according to claim 8, wherein the pentagons of the first apertures of the first and the second slit members are formed in such a manner that the third and the fifth angles, except for the first, the second and the fourth angles, which are respectively formed into a right angle, are respectively formed to 135°.

10. A pattern exposure-formation method in which the variable rectangle-type electron beam exposure apparatus described in claim 8 is used, comprising the step of forming an exposure pattern by combining a first exposure pattern with a second exposure pattern wherein, in the first exposure pattern, the exposure is conducted by shifting a first rectangular electron beam little by little which is formed when an electron beam transmitted through a peripheral region including the first angle or the second angle of the pentagonal aperture of the first slit member is transmitted through a peripheral region including the first angle or the second angle of the pentagonal aperture of the second slit member, and in the second exposure pattern, the exposure is conducted by shifting a second rectangular electron beam little by little which is formed when an electron beam transmitted through a peripheral region including the fourth angle of the pentagonal aperture of the first slit member is transmitted through a peripheral region including the fourth angle of the pentagonal aperture of the second slit member.

11. A pattern exposure-formation method according to claim 10, wherein a shape, aspect ratio, or size of each rectangular electron beam of the first and the second exposure patterns is changed according to a predetermined pattern shape, such as an angle or width thereof, to be formed.

12. A pattern exposure and formation method in which the variable rectangle-type electron beam exposure apparatus described in claim 10 is used, wherein when a continuous exposure pattern is formed by conducting exposure while a rectangle-type electron beam for irradiating a face to be exposed is being shifted a little, exposure is conducted while the exposure interval is set 1/N pitch (N is an integer greater than 1) and each beam irradiation is set at a value lower than a predetermined value, wherein one pitch is an exposure interval in the case where a side of the rectangle of the electron beam to be exposed first and a side of the rectangle of the electron beam to be exposed next are successively connected with each other under the condition that regions to be exposed are not overlapped on each other, and an exposure interval is 1/N pitch in the case where an irradiation of each beam is set at said predetermined value when exposure is conducted at the interval of one pitch.

13. A pattern exposure and formation method in which the variable rectangle-type electron beam exposure apparatus described in claim 10 is used, wherein when a triangular pattern having a side not parallel with a side of a variable rectangle used for exposure is made, the variable rectangle is exposed being overlapped by ½ pitch in an inside region of the triangle.

14. A variable rectangle-type electron beam exposure apparatus according to claim 7, wherein the first and the second slit members are formed into flat-plate shapes and are arranged in parallel wih each other.

15. A variable rectangle-type electron beam exposure appratus according to claim 7, wherein the pentagons of the first and the second apertures of the first and the second slit members are formed into the same shape and size.

16. A variable rectangle-type electron beam exposure apparatus according to claim 7, wherein the pentagon of the first aperture of the first slit member and that of the second aperure of the second slit member are similar to each other, and the pentagon of the second aperture of the first slit member and that of the second aperture of the second slit member are also similar to each other.

* * * * *